United States Patent [19]

Sano et al.

[11] 4,105,945
[45] Aug. 8, 1978

[54] ACTIVE LOAD CIRCUITS

[75] Inventors: Nobuya Sano, Nara; Hiroshi Goto, Katano; Yutaka Hirota, Toyonaka, all of Japan

[73] Assignee: Matsushita Electric Industrial Co., Ltd., Japan

[21] Appl. No.: 778,148

[22] Filed: Mar. 16, 1977

[30] Foreign Application Priority Data

Mar. 16, 1976 [JP] Japan .................................. 51-28718
Mar. 17, 1976 [JP] Japan .................................. 51-29495

[51] Int. Cl.² .............................................. H03F 1/34
[52] U.S. Cl. ..................................... 330/294; 330/107
[58] Field of Search .................... 330/28, 85, 107, 109, 330/145; 307/237; 333/28 R

[56] References Cited

U.S. PATENT DOCUMENTS 3,736,517   5/1973   Lim ................................. 333/28 R
3,763,382  10/1973   Hurichi et al. ................. 330/145 X

OTHER PUBLICATIONS

Jenkins, "Active Filter Has Separate Band and Frequency Controls," *Electronics*, Sep. 11, 1972, p. 110.

Primary Examiner—James B. Mullins
Attorney, Agent, or Firm—Burgess, Ryan and Wayne

[57] ABSTRACT

An active load circuit is interconnected between a signal source such as a pickup cartridge and an amplifier which acts as an impedance matching resistor. An equivalent resistance provided by the amplifier as viewed from the signal source equals a required resistance for impedance matching, and the noise voltage is considerably reduced as compared with that produced by a conventional matching resistor.

16 Claims, 14 Drawing Figures

ACTIVE LOAD CIRCUITS

BACKGROUND OF THE INVENTION

The present invention relates to active load circuits which are used as matching resistors for interconnection between an amplifier and a signal source for reducing voltage noise to a minimum.

Prior Art, FIG. 1

FIG. 1 shows an example of an interconnection between an amplifier and a signal source which requires a matching resistor. In FIG. 1, reference numeral 1 designates a moving-magnet type pickup cartridge whose inductance and resistance are represented by 2 and 3, respectively; 4, an input terminal of an RIAA equalizer-amplifier; 5, a matching resistor; 6, an amplifier with an input terminal $a$, a feedback terminal $b$ and an output terminal $c$; 7 through 11, components making up a feedback circuit which is interconnected between the output and feedback terminals of the amplifier and exhibits an inversed RIAA characteristic; and 12, an output terminal of the equalizer-amplifier.

In general, the frequency characteristic of the pickup cartridge 1 changes depending upon a load resistance, which is supplied from the pickup cartridge manufactures. Of the noise produced from the load resistor 5, the noise at low frequencies present no serious problem because the noise is shunt by the resistance element 3 of the cartridge 1 having a sufficiently smaller value than the load resistor 5, but when the inductance element 2 of the cartridge 1 is high, the noise at higher frequencies is not shunt by the cartridge 1 so that a low signal-to-noise ratio S/N results. In addition there is a problem that when the input terminal of the equalizer-amplifier is opened, the noise due to the load resistor 5 is amplified without being shunt by the cartridge 1.

SUMMARY OF THE INVENTION

The present invention therefore provides an active load circuit including an amplifier and exhibiting an equivalent resistance as viewed from an input terminal of the amplifier equal to a required matching resistance, and being capable of reducing considerably the noise voltage as compared with that produced when a matching resistor is used.

BRIEF DESCRIPTION OF THE ACCOMPANYING DRAWINGS

FIG. 1 is a circuit diagram of a prior art RIAA equalizer for use in conjunction with a moving-magnet type pickup cartridge;

FIGS. 2 through 6 are electrical circuit diagrams of from a first to a fifth embodiments, respectively of the present invention which are based upon a first underlying principle thereof and are shown as being applied for the purpose of impedance matching between a moving-magnet type pickup cartridge and an RIAA equalizer-amplifier; and FIGS. 7 through 14 are electrical circuit diagrams of from a sixth to a thirteenth embodiments, respectively, which are based on a second underlying principle of the present invention.

Same reference numerals are used to designate to similar parts throughout the figures.

DESCRIPTION OF THE PREFERRED EMBODIMENTS

Preferred Embodiments Based upon First Underlying Principle (FIGS. 2 through 6)

Figure 2:
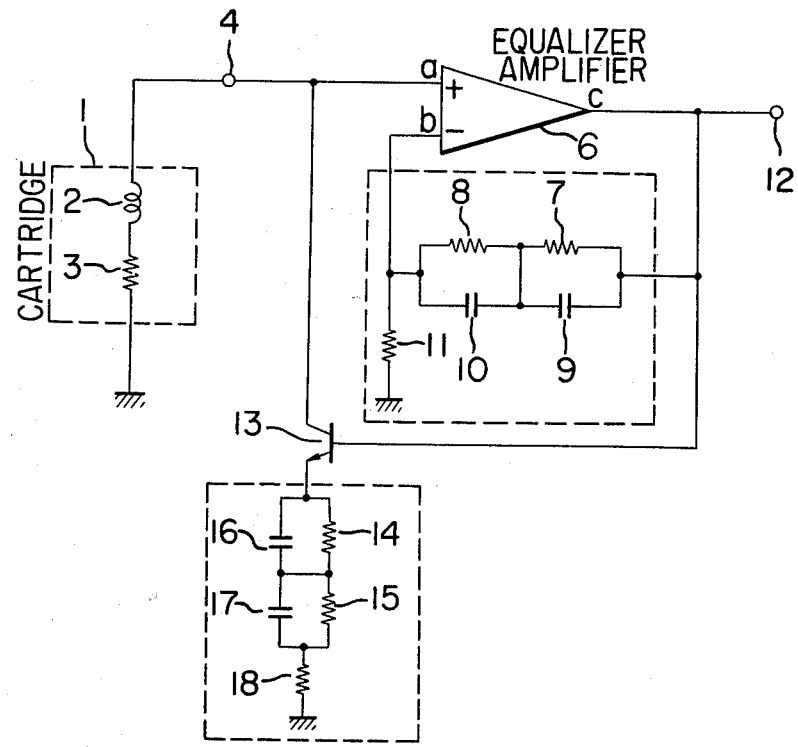

First Embodiment, FIG. 2

Figure 1:
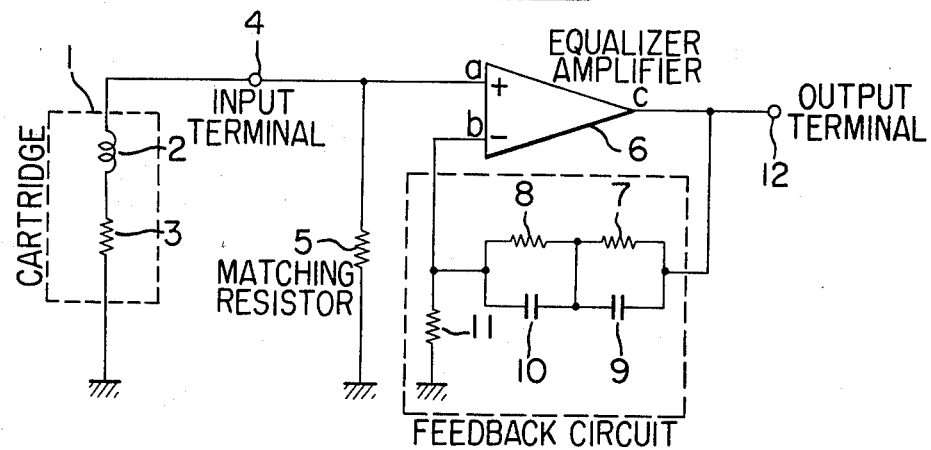

In addition to parts 1 through 12 described in conjunction with FIG. 1, a preferred embodiment shown in FIG. 2 includes a transistor 13 and an emitter circuit consisting of resistors 14, 15 and 18 and capacitors 16 and 17 and having an impedance vs. frequency characteristic similar to that of the feedback circuit consisting of the elements 7 through 11.

The resistor 18 has the same value $R_L$ as the load resistor 5 shown in FIG. 1, and the impedance ratios between the resistors 7 and 14, resistors 8 and 15, capacitors 9 and 16 and capacitors 10 and 17 are all equal to the ratio between the resistors 11 and 18. Therefore, the emitter circuit 14 through 18 has the same impedance frequency characteristic as the feedback circuit 7 through 11. Since the voltages (which are equal to the output voltage from the equalizer-amplifier) impressed across these circuits are equal, the voltages across the resistors 11 and 18 are equal, and so are the voltages across the resistor 11 and at the input terminal 4. As a result, when a voltage V is applied to the input terminal 4, the voltages across the resistors 11 and 18 are also V. Then the current $V/R_L$ (ampers) flows through the resistor 18, this current being the emitter and collector currents of the transistor 13. As a result, the equivalent resistance as viewed from the input terminal 4 toward the equalizer-amplifier 6 is $R_L$ (ohms) which is equal to the value of the load resistor 5 shown in FIG. 1.

Meanwhile the emitter circuit 14 through 18 has an impedance $A_1(f)R_L$ where $A_1(f)$ is a gain of the equalizer-amplifier at a frequency f. The noise voltage Vn at the input terminal 4 produced by the noise voltage $e_{nE}$ from the emitter circuit 14 through 18 when the cartridge (signal source) 1 is opened is given by $$Vn = \frac{A_1(f) \cdot V_n - e_{nE}}{A_1(f) \cdot R_L} Rin$$

where Rin is an input impedance of the amplifier 6. Assuming $Rin >> R_L$, we have $$Vn = \frac{e_{nE} \cdot Rin}{A_1(f) \cdot R_L + A_1(f) \cdot Rin} \approx \frac{e_{nE}}{A_1(f)} \quad (1)$$

The noise voltage $e_{nE}$ is given by $$e_{nE} = \sqrt{4k \cdot T \cdot \Delta f \cdot R_L \cdot A_1(f)}$$

where
$k$ = Boltzman's constant,
$T$ = absolute temperature, and
$\Delta f$ = a noise frequency band.
Substituting $e_{nE}$ in Eq. (1), we have $$Vn \approx \frac{1}{A_1(f)} \sqrt{4k \cdot T \cdot \Delta f \cdot R_L \cdot A_1(f)} \quad (2)$$

$$= \frac{1}{\sqrt{A_1(f)}} \sqrt{4k \cdot \Delta f \cdot R_L}$$

Eq. (2) shows that the noise voltage Vn produced in the first embodiment is reduced to $1/\sqrt{A_1(f)}$ as compared with the noise voltage produced by the load resistor 5 in the prior art circuit shown in FIG. 1. For instance, assume that the amplification factor $A_1$ (1 KHz) is 75. Then the noise voltage at 1 KHz is reduced to $1/\sqrt{75}$ in the first embodiment. Furthermore, the lower the frequency, the higher the gain $A_1(f)$ becomes so that the lower the frequency, the more the noise voltage is suppressed while the higher the frequency, the less the noise voltage is suppressed. However, the noise voltage can be suppressed to $1/\sqrt{7.5}$ at 20 KHz which is the upper limit of the audio frequency band.

Figure 3:
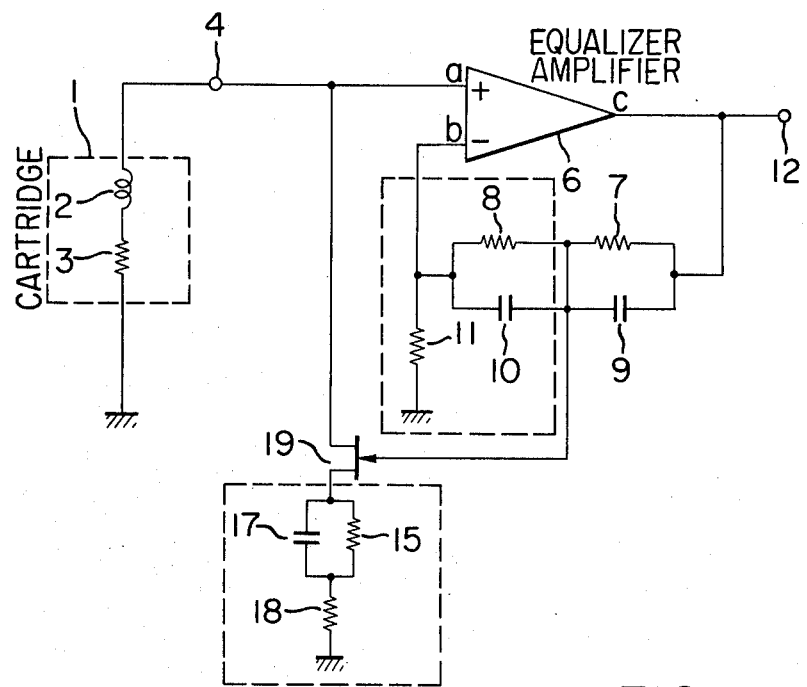

Second Embodiment, FIG. 3

In the second embodiment shown in FIG. 3, a voltage at the junction point between a first parallel circuit consisting of the resistor 7 and the capacitor 9 and a second parallel circuit consisting of the resistor 8 and the capacitor 10 in the feedback circuit is applied to the gate of a field-effect transistor 19 whose source is connected to a source circuit consisting of the resistors 15 and 18 and the capacitor 17 and the impedance frequency characteristic substantially similar to that of a circuit consisting of the resistors 8 and 11 and the capacitor 10 in the feedback circuit.

In the second embodiment, a gain at a frequency f from the input terminal 4 and the junction point between the first and second parallel circuits 7 and 9, and 8 and 10 is denoted by $A_2(f)$. The equivalent resistance as viewed from the input terminal 4 is also equal to $R_L$, and the noise voltage at the input terminal 4 due to the noise voltage from the source circuit 15, 17 and 18 is reduced by a factor of $1/\sqrt{A_2(f)}$ as compared with the noise voltage produced by the load circuit 5 in the prior art circuit shown in FIG. 1.

Figure 4:
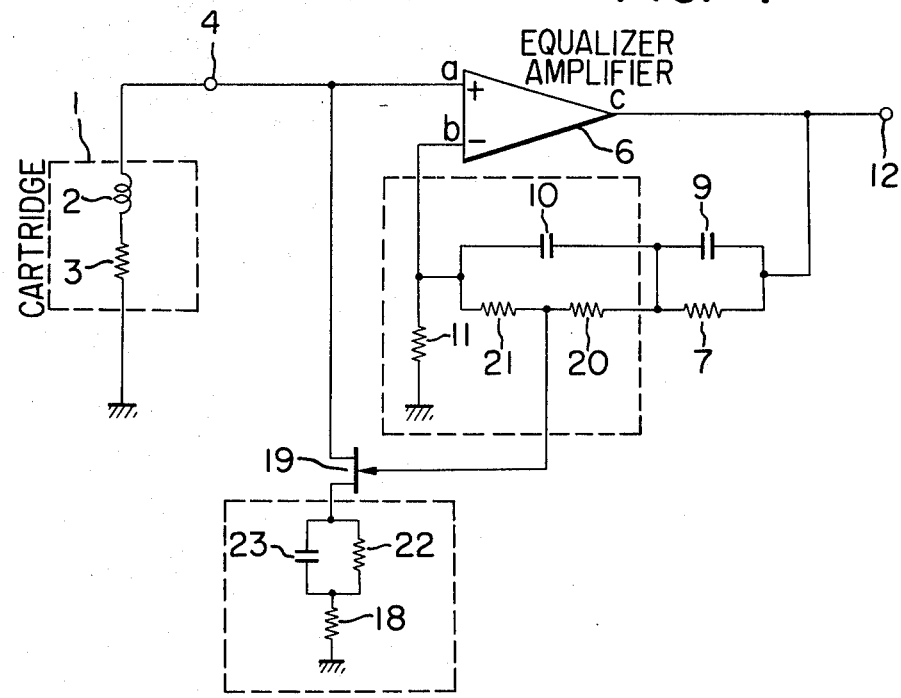

Third Embodiment, FIG. 4

In the third embodiment shown in FIG. 4, the resistor 8 in the feedback circuit is replaced by resistors 20 and 21 connected in series, the resultant resistance of these resistors 20 and 21 being equal to the value of the resistor 8, and the junction point between them is connected to the gate of the field-effect transistor 19 whose source is connected to a source circuit consisting of the resistors 18 and 22 and a capacitor 23 and having the impedance frequency characteristic similar to that as viewed from the junction point between the resistors 20 and 21 toward the input terminal 4. The ratio between the resistors 21 and 22 is equal to that between the resistors 11 and 18, and the capacitor 23 has a value $$C_{23} = C_{10} \times \frac{R_{20} + R_{21}}{R_{21}} \times \frac{R_{11}}{R_{18}}$$

where $C_{10}$ = value of the capacitor 10, and $R_{11}$, $R_{18}$, $R_{20}$ and $R_{21}$ = values of the resistors 11, 18, 20 and 21.

In the third embodiment, a gain at a frequency f from the input terminal 4 to the junction point between the resistors 20 and 21 is denoted by $A_3(f)$. The equivalent resistance as viewed from the input terminal 4 is also equal to $R_L$ and the noise voltage at the input terminal 4 due to the noise voltage from the source circuit 18, 22 and 23 is reduced by a factor of $1/\sqrt{A_3(f)}$ as compared with the noise voltage from the load resistor 5 in the prior art circuit shown in FIG. 1.

Figure 5:
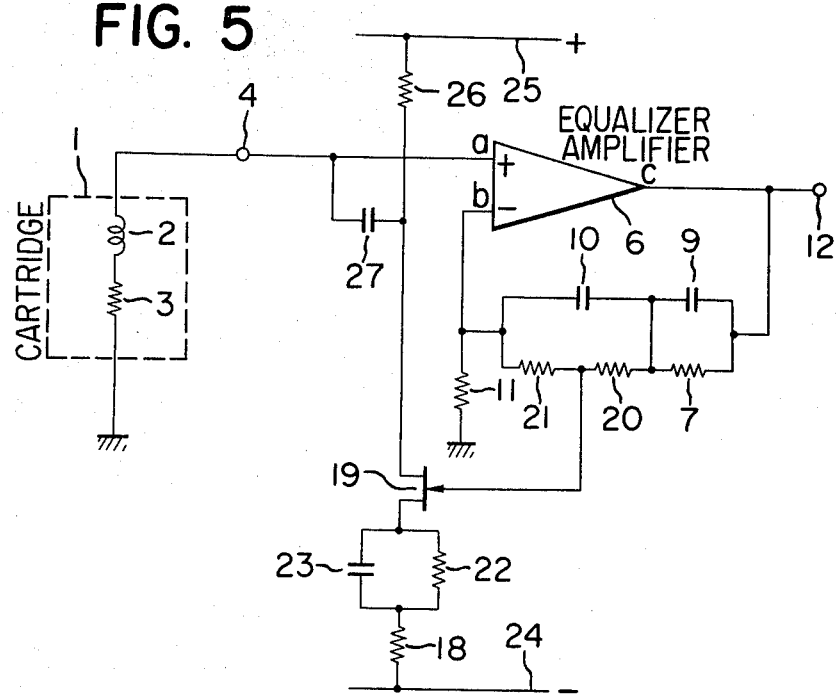

Fourth Embodiment, FIG. 5

The fourth embodiment shown in FIG. 5 is more advantageous in that the DC operation of the field-effect transistor 19 has been taken into consideration. That is, the source of the field-effect transistor 19 is connected to a negative power source 24 through the resistors 22 and 18 in the source circuit, whereas the drain is connected through a resistor 26 to a positive power source 25. An AC output current drained from the drain is applied through a coupling capacitor 27 to the input terminal a of the amplifier 6.

In the AC operation, the resistor 26 also functions as a load connected in parallel with the active load circuit so that the value of the resistor 18 must be corrected accordingly. When the resistor 26 has a relatively small value, the noise voltage produced therefrom decrease the noise voltage reduction effect so that it is preferable in practice to select the resistor 26 having as high a value as possible. However, the voltage of the positive power source 25 must be increased accordingly in order to supply a required drain current.

Figure 6:
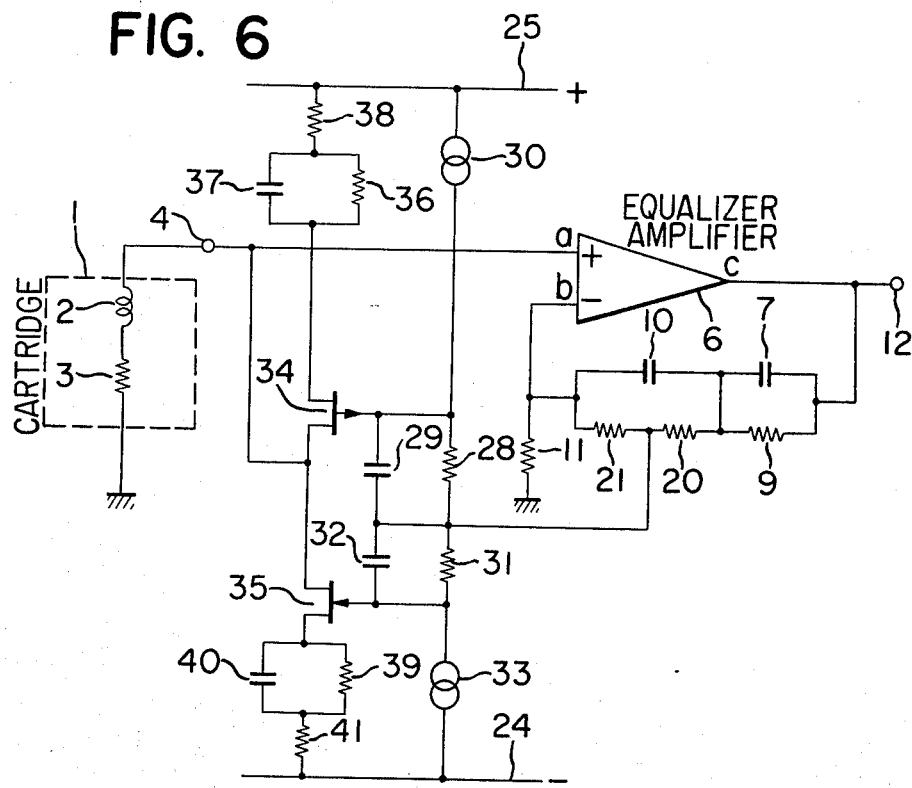

Fifth Embodiment, FIG. 6

The fifth embodiment shown in FIG. 6 is a modification of the fourth embodiment shown in FIG. 5 in order to offset the adverse effect of the resistor 26 on the noise reduction effect. Instead of the field-effect transistor 19 shown in FIG. 5, a push-pull circuit consisting of a p-channel field-effect transistor 34 and an n-channel field-effect transistor 35 is employed in order to eliminate a resistor through which the drain current flows.

The source of the p-channel field-effect transistor 34 is connected to a first source circuit consisting of resistors 36 and 38 and a capacitor 37, whereas the source of the n-channel field-effect transistor 35 is connected to a second source circuit consisting of resistors 39 and 41 and a capacitor 40. Both the first and second source circuits have the impedance frequency characteristic similar to that of the source circuit 18, 22 and 23 (See FIGS. 4 and 5). Furthermore the impedance when the first and second source circuits are connected in parallel is equal to that of the source circuit 18, 22 and 23 (See FIGS. 4 and 5). Instead of employing two source circuits, only one of them may be used and the sources of the field-effect transistors 34 and 35 are interconnected through a capacitor.

In the fifth embodiment, the drains of the field-effect transistors 34 and 35 are shown as being directly connected to the input terminal a of the amplifier 6, but they may be indirectly coupled through a coupling capacitor to the input terminal a while being grounded through a leak resistor.

A first voltage shift circuit consisting of a resistor 28, a capacitor 29 and a constant current source 30 and a second voltage shift circuit consisting of a resistor 31, a capacitor 32 and a constant current source 33 are provided in order to prevent the voltage saturation between the sources and drains of the field-effect transistors 34 and 35.

In the first through fifth embodiments, the transistors may be replaced with field-effect transistors and vice versa, but the noise voltage reduction effect remains unchanged.

Preferred Embodiments Based on Second Underlying Principle, FIGS. 7 through 14

Figure 7:
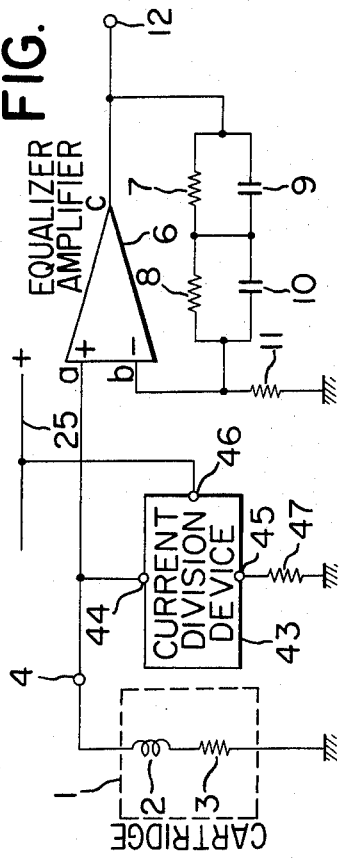

Sixth Embodiment, FIG. 7

In addition to the components 1 through 11, the sixth embodiment includes a current division device 43 with a first terminal 44 connected to the input terminal 4, a second terminal 45 grounded through a load resistor 47 and a third terminal 46 connected to the positive power supply source 25. It is a reciprocal system wherein both the AC voltage gain from the first terminal 44 to the second terminal 45 and the AC voltage gain from the second terminal 45 to the first terminal 44 are unity. Furthermore, the current division device 43 is so designed and constructed that of the current flowing into the second terminal 45, $1/n$ is derived from the first terminal 44 while $(n-1)/n$ is derived from the third terminal 46. That is, the current gain from the first terminal 44 to the second terminal is $n$. The value of the resistor 47 is $1/n$ of the value $R_L$ of the load resistor 5 in the prior art circuit shown in FIG. 1.

When a voltage V is impressed on the first terminal 44, the voltage V is derived from the second terminal 45 whereas the current is $$\frac{V}{\frac{R_L}{n}}.$$

Since the current at the first terminal 44 is $1/n$ of the current at the second terminal 45, the former is $V/R_L$ so that the resistance as viewed from the input terminal 4 toward the first terminal 44 is $R_L$ (ohms) which is equal to the value of the load resistor 5 in the prior art circuit shown in FIG. 1.

The noise voltage $e_{nR}$ produced by the load resistor 47 is given by $$e_{nR} = \sqrt{4k \cdot T \cdot \Delta f \cdot \frac{R_L}{n}} \text{ (volts)}$$

The voltage gain from the second terminal 45 to the first terminal 44 is unity. Therefore when the amplifier 6 has a sufficiently high input impedance and when the cartridge 1 is opened, the noise voltage $Vn$ which appears at the input terminal 4 is given by $$Vn = e_{nR} = \sqrt{4k \cdot T \cdot \Delta f \cdot \frac{R_L}{n}} \text{ (volts)}$$

It is seen that the noise voltage is reduced by a factor of $\sqrt{1/n}$ as compared with the noise voltage produced by the load resistor 5 in the prior art circuit shown in FIG. 1.

In summary, the active load circuit consisting of the current division device 43 and the load resistor 47 exhibits an effective load resistance equal to that of the load resistor 5 for matching in the prior art circuit shown in FIG. 1 and can reduce the noise voltage by a factor of $\sqrt{1/n}$ as compared with the noise voltage produced by the matching resistor 5.

The current division device 43 may be a transistor whose base corresponds to the first terminal 44; emitter, to the second terminal 45; and collector, to the third terminal 46.

Figure 8:
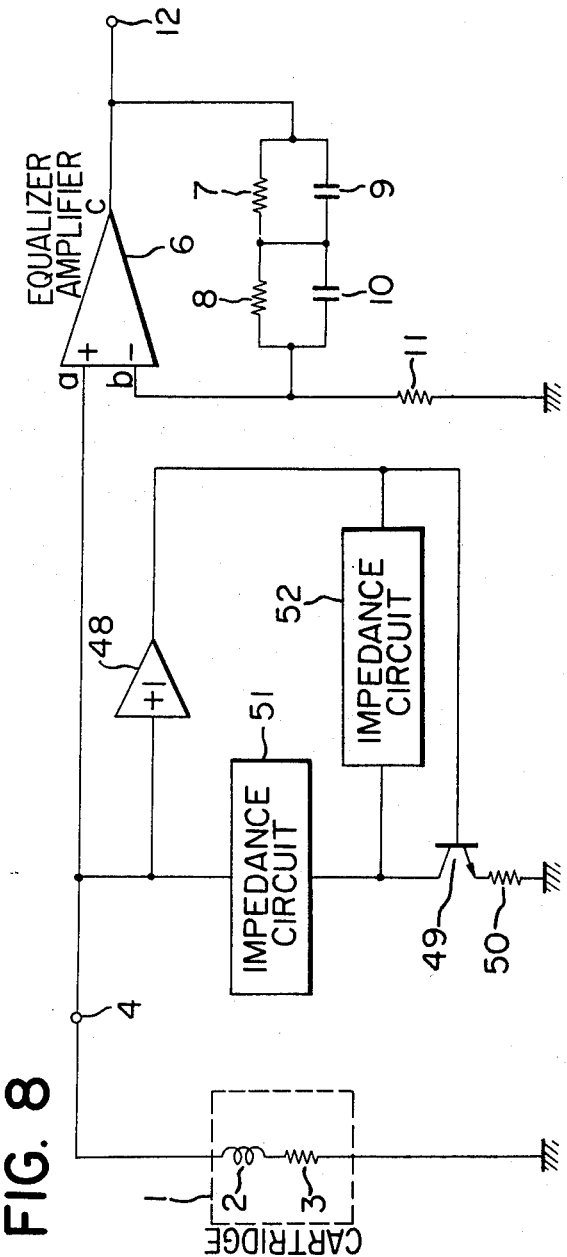

Seventh Embodiment, FIG. 8

The active load circuit shown in FIG. 8 comprises an amplifier 48 with a voltage gain equal to unity which is a first active circuit means, a transistor 49 which is a second active circuit means, a load resistor 50, and first and second impedance circuits 51 and 52. The amplifier 48 has a high imput impedance and a low output impedance, and the impedances $Z_1$ and $Z_2$ of the first and second impedance circuits 51 and 52 are such that $$\frac{Z_2}{Z_1 + Z_2} = \frac{1}{n}$$

The value of the load resistor 50 is set to $R_L/n$.

A voltage V impressed at the input terminal 4 is applied through the amplifier 48 with the gain 1 to the base of the transistor 49 so that the voltage V (volts) appears at emitter. As a result, the current $$\frac{Vv}{\frac{R_L}{n}} \text{ (ampers)}$$

flows through the load resistor 5, and the collector current is divided to flow through the first and second impedance circuits 51 and 52. Since the voltages across the first and second impedance circuits 51 and 52 are equal, of the collector current $$\frac{Z_2}{Z_1 + Z_2} = \frac{1}{n}$$

flows through the first impedance circuit 51 while $$\frac{Z_1}{Z_1 + Z_2},$$

through the second impedance circuit 52. That is, the current flowing through the first impedance circuit 51 is $$\frac{nV}{R_L} \cdot \frac{1}{n} = \frac{V}{R_L} \text{ (ampers)}.$$

Both the amplifiers 48 and 6 have high input impedance so that the current $V/R_L$ from the first impedance circuit 51 flows toward the input terminal 4 of the equalizer-amplifier so that the equivalent resistance as viewed from the input terminal toward the equalizer-amplifier is also $R_L$ (ohms) which is equal to that of the load resistor 5 in the prior art circuit shown in FIG. 1.

Next let us consider the noise voltage $V_n$ at the input terminal 4 due to the noise voltage $e_{nR}$ from the load resistor 50 when the cartridge 1 is opened. They are corelated by the following expression:

$$Vn = Vn - \frac{V_n - e_{nR}}{\frac{R_L}{n}}$$

Hence, $$Vn = e_{nR}$$

But $$e_{nR} = \sqrt{4k \cdot T \cdot \Delta f \cdot \frac{R_L}{n}}$$

Therefore $$Vn = \sqrt{4k \cdot T \cdot \Delta f \cdot \frac{R_L}{n}}.$$

Thus, the noise voltage may be reduced by a factor of $\sqrt{1/n}$ as compared with the noise voltage produced by the load resistor 5 in the prior art circuit shown in FIG. 1.

Figure 14:
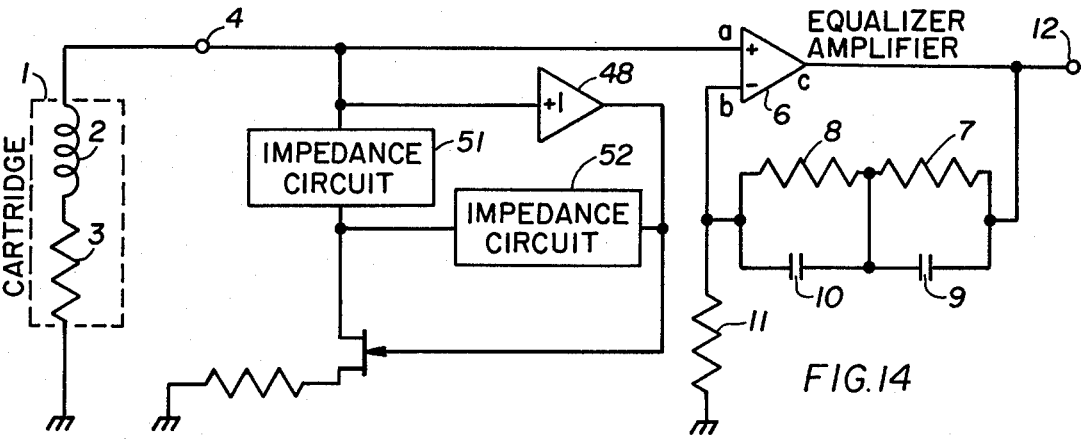

In summary, the active load circuit 48 through 52 exhibits an effective load resistance equal to that of the load resistor 5 in the prior art circuit shown in FIG. 1 and can reduce the noise voltage by a factor of $\sqrt{1/n}$ as compared with the noise voltage produced by the load resistor 5. In the seventh embodiment a field-effect transistor may be used instead of transistor 49 as shown in FIG. 14.

Figure 9:
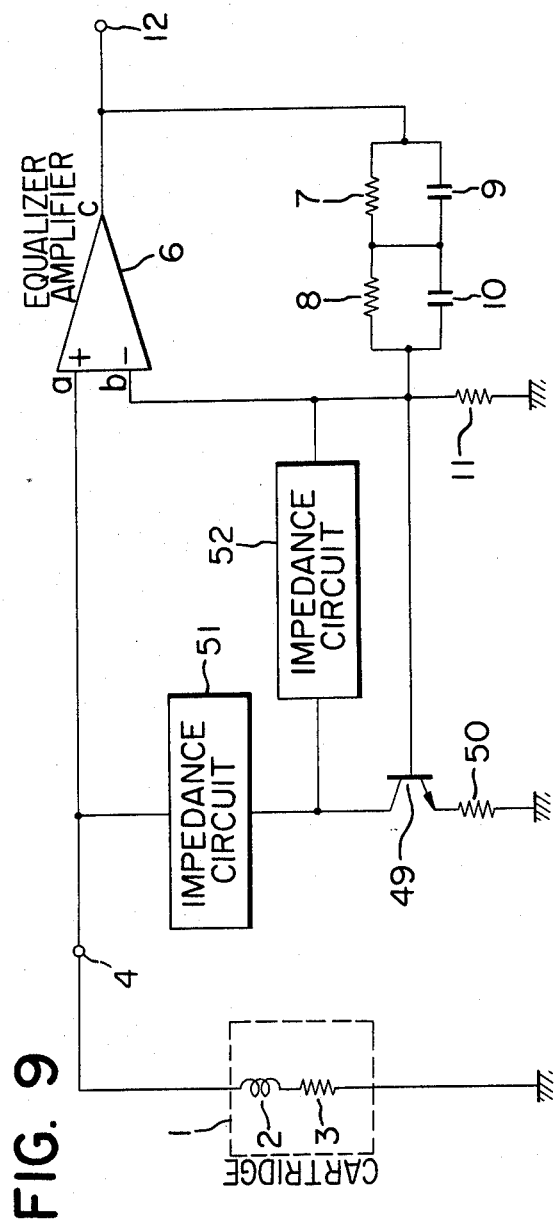

Eighth Embodiment, FIG. 9

In the seventh embodiment described with reference to FIG. 9 the amplifier 48 with the gain of unity may be a transistor emitter follower, (FIG. 11) a field-effect transistor source follower (FIGS. 12 and 13) or an operational amplifier with a 100% feedback, but when the amplifier 6 has a high amplification factor, the output terminal of the feedback circuit may be used as the output of the amplifier 48 shown in FIG. 8. The noise voltage reduction effect attained by the eighth embodiment is substantially equal to that of the seventh embodiment.

Figure 10:
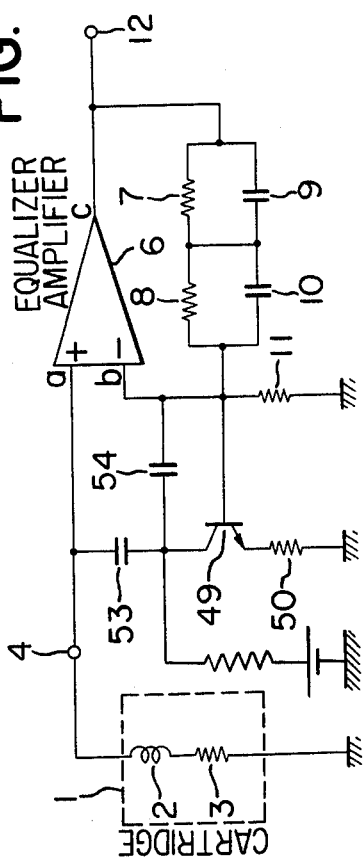
Figure 11:
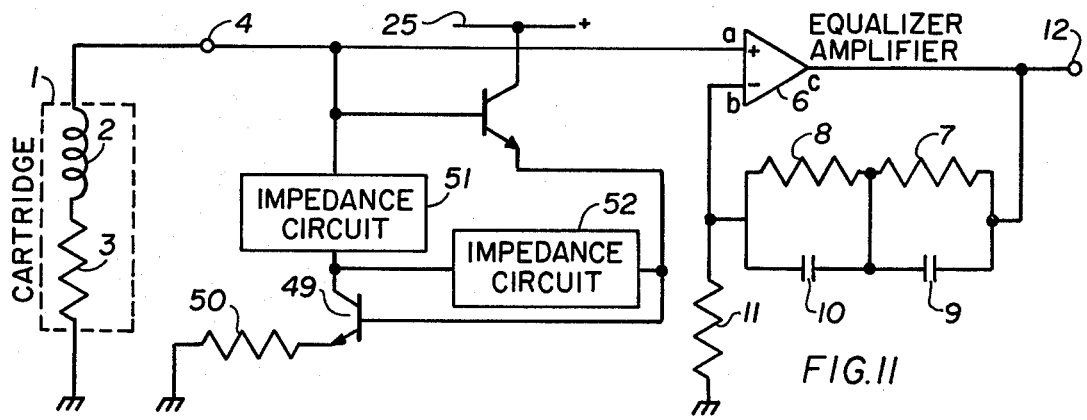
Figure 12:
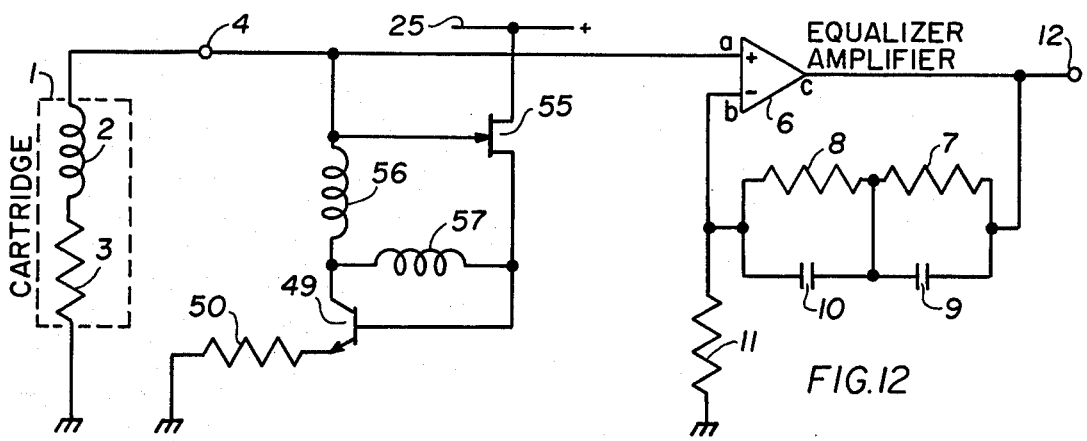
Figure 13:
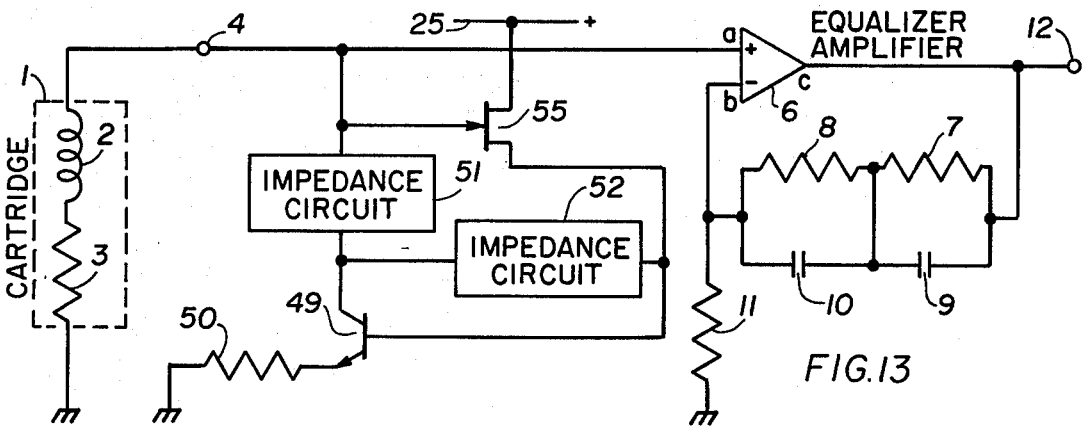

Ninth Embodiment, FIG. 10

The ninth embodiment shown in FIG. 10 is substantially similar in construction to the eighth embodiment shown in FIG. 9 except that the first and second impedance circuits 51 and 52 consist of first and second capacitors 53 and 54, respectively. This arrangement is advantageous in that the noise voltages produced from the first and second impedance circuits 51 and 52 are negligible because they consists of only capacitors 53 and 54. Instead of the capacitors 53 and 54, inductance elements may be used.

In the seventh, eighth and ninth embodiments, the base of the transistor 49 has been described as being connected to the output terminal of the amplifier 48 or the feedback circuit 7–11, but when the transistor 49 has a high base input impedance, the base may be connected to the input terminal 4 of the equalizer-amplifier. In the eighth and ninth embodiments, instead of the transistor 49, a field-effect transistor may be used with the base and collector replaced with the gate and source, respectively.

What is claimed is:

1. An active load circuit comprising
(a) an amplifier having an input terminal, an output terminal and a feedback terminal and a feedback circuit interconnected between the output and feedback terminals,
(b) a circuit having an impedance frequency characteristic similar to that as viewed from one point in said feedback circuit including the output terminal toward the feedback terminal, and
(c) an active circuit for causing said circuit defined in (b) to convert the voltage at one point in said feedback circuit into current which in turn is applied to the input terminal of said amplifier.

2. An active load circuit as set forth in claim 1 wherein said active circuit comprises a transistor whose base is connected to a predetermined point in said feedback circuit, whose emitter is connected to said circuit defined in (b) in claim 1, and whose collector is connected to the input terminal of said amplifier.

3. An active load circuit as set forth in claim 2 wherein means is provided for supplying DC current to the collector of said transistor, and said collector is connected through a capacitor to the input terminal of the amplifier.

4. An active load circuit as set forth in claim 1 wherein said active circuit comprises a push-pull circuit comprising a pair of complementary symmetry transistors.

5. An active load circuit as set forth in claim 4 wherein each transistor has two main electrodes and a control electrode, and wherein corresponding main electrodes of said transistors are connected to respective first and second impedance circuits having the same impedance-frequency characteristic as said circuit recited in clause (b) of claim 1.

6. An active load circuit as set forth in claim 4 wherein the control electrodes of said transistors are connected to said predetermined point in said feedback circuit through first and a second voltage shift circuits, respectively.

7. An active load circuit according to claim 1, wherein said active circuit comprises a field-effect transistor whose gate is connected to a predetermined point in said feedback circuit whose source is connected to said circuit defined in (b) in claim 1, and whose drain is connected to the input terminal of said amplifier.

8. An active load circuit according to claim 7, wherein means is provided for supplying DC current to the drain of said field-effect transistor, said drain being connected through a capacitor to the input terminal of the amplifier.

9. An active load circuit comprising
(a) first active circuit means having a high impedance input terminal and a low impedance output terminal, the voltage derived from said output terminal following the voltage applied to said input terminal,
(b) resistor means,
(c) second active circuit means for causing the voltage at one of said terminals of said first active circuit means to be converted into current through said resistor means, said second active circuit means having a current output terminal,
(d) a first impedance circuit comprising at least one first impedance element of a given type distinct from said resistor means and interconnected between the input terminal of said first active circuit means and the current output terminal of said second active circuit means, and
(e) a second impedance circuit comprising at least one second impedance element of the same type as said first impedance element distinct from said first impedance circuit and interconnected between the output terminal of said first active circuit means and said current output terminal of said second active circuit means.

10. An active load circuit as set forth in claim 9 wherein said first active circuit means consists of an amplifier with an input terminal and a feedback terminal, the feedback terminal comprising as the output terminal of said first active circuit means.

11. An active load circuit as set forth in claim 9 wherein said first active circuit means comprises a transistor emitter-follower with the emitter thereof corresponding to the output terminal of said first active circuit means and the base thereof corresponding to the input terminal thereof.

12. An active load circuit as set forth in claim 9 wherein said second active circuit means comprises a transistor having the base thereof connected to one of said terminals of said first emitter circuit means, the meitter of said transistor being connected to said resistor means, and the collector of said transistor comprising said current output terminal.

13. An active load circuit as set forth in claim 9 wherein said first and second impedance circuits comprise capacitive reactive elements only.

14. An active load circuit as set forth in claim 9 wherein said first and second impedance circuits comprise inductive reactive elements only.

15. An active load circuit as set forth in claim 9 wherein said first active circuit means comprises a field-effect transistor source follower with the gate thereof corresponding to the input terminal of said first active circuit means and the source thereof corresponding to the output terminal of said first active circuit means.

16. An active load circuit as set forth in claim 9 wherein said second active circuit means comprises a field-effect transistor with the gate thereof connected to one of said terminals of said first active circuit means and the source thereof connected to said resistor means, the drain of said field-effect transistor comprising said current output terminal.

* * * * *

UNITED STATES PATENT OFFICE
CERTIFICATE OF CORRECTION

Patent No. 4,105,945      Dated August 8, 1978

Inventor(s) Nobuya Sano, et al

It is certified that error appears in the above-identified patent and that said Letters Patent are hereby corrected as shown below:

Column 9, line 12: "meitter" should be --emitter--.

Signed and Sealed this

Eighth Day of May 1979

[SEAL]

Attest:

RUTH C. MASON
*Attesting Officer*

DONALD W. BANNER
*Commissioner of Patents and Trademarks*